United States Patent [19]

Ditchek et al.

[11] Patent Number: 4,829,173

[45] Date of Patent: May 9, 1989

[54] RADIATION DETECTING APPARATUS

[75] Inventors: Brian M. Ditchek, Milford; Mark Levinson, Sudbury; Ben G. Yacobi, Natick, all of Mass.

[73] Assignee: GTE Laboratories Incorporated, Waltham, Mass.

[21] Appl. No.: 20,629

[22] Filed: Mar. 2, 1987

[51] Int. Cl.$^4$ ............................................. H01L 27/14
[52] U.S. Cl. .................................. 250/211 R; 357/30; 357/15; 357/55
[58] Field of Search ...................... 250/211 R, 211 J; 357/30 B, 30 D, 30 G, 15, 55, 88

[56] References Cited

U.S. PATENT DOCUMENTS 4,482,907 11/1984 Jay ......................................... 357/55
4,624,045 11/1986 Ishihara et al. .................... 357/30 D
4,660,066 4/1987 Reid ................................. 357/30 D

OTHER PUBLICATIONS

Ditchek, "Preparation and Electrical Properties of a Directionally Solidified Ge-TiGe$_2$ Eutectic", J. Appl. Phys., 57(6); Mar. 15, 1985; pp. 1961-1967.

Ditchek, "Bridgman and Czochralski Growth of Ge-TiGe$_2$ Eutectic Composites", Journal of Crystal Growth, 75 (1986), pp. 264-268.

Primary Examiner—Edward P. Westin
Attorney, Agent, or Firm—David M. Keay

[57] ABSTRACT

A semiconductor photodetector having a body which includes a matrix of semiconductor material, specifically silicon, having an array of individual rods of conductive material, specifically TaSi$_2$, disposed therein. The rods form Schottky barriers with the semiconductor material. An ohmic contact is made to several of the rods at one end, and an ohmic contact is made to the semiconductor material of the matrix. Incident radiation is directed at a surface of the body containing the opposite ends of the rods. A detector is connected between the two ohmic contacts and detects current flow generated in response to incident radiation impinging on the body.

18 Claims, 2 Drawing Sheets

RADIATION DETECTING APPARATUS

This invention was made with Government support under Contract N00014-86-C-0595 awarded by the Department of the Navy. The Government has certain rights in the invention.

BACKGROUND OF THE INVENTION

This invention relates to apparatus for detecting incident radiation. More particularly, it is concerned with radiation detecting apparatus employing semiconductor photodiodes.

In conventional semiconductor photodiodes the electric field generated by a rectifying junction is used to separate and to collect the charge carriers (electrons or holes) produced in the semiconductor material by the absorption of incident radiation, specifically energetic particles or photons of light. This action requires that the light be absorbed by the semiconductor material at or near the junction, so that the electrons or holes can diffuse to it and be collected before encountering a recombination center in the semiconductor crystal. In conventional semiconductor photodiodes the junction is parallel to and at a fixed depth below the illuminated surface. Thus, the efficiency of conventional devices varies depending upon the depth of penetration of the radiation with respect to the depth of the junction.

SUMMARY OF THE INVENTION

Improved efficiency and sensitivity over a wide range of wavelengths of incident radiation is obtained in apparatus in accordance with the present invention. Apparatus in accordance with the invention comprises a body including a matrix of semiconductor material having disposed therein an array of individual rods of conductive material forming rectifying barriers at the interfaces of the rods and the semiconductor material. A first conductive contact member at a first surface of the body is in ohmic contact with a plurality of the rods at one end of each of the rods of the plurality. A second conductive contact member is in ohmic contact with the semiconductor material of the matrix. The body is adapted to receive incident radiation at a portion of a second surface. The portion is adjacent to some of the rods of the plurality so that charge carriers produced by the absorption of radiation in the body are collected at the rectifying barriers. The apparatus also includes current detecting means connected to the first and to the second conductive contact members for detecting the flow of electrical current generated by the collection of charge carriers at the rectifying barriers.

BRIEF DESCRIPTION OF THE DRAWINGS

In the drawings:

In FIGS. 1, 2, and 2A the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION

Radiation detecting apparatus in accordance with the present invention employs a photodiode fabricated from a body of semiconductor material containing an array of conductive rods which form rectifying barriers with the semiconductor material. In producing the body in which devices of the present invention are to be fabricated, a charge containing the constituents of a eutectic composition of a semiconductor material and a conductive material is prepared. Any of several eutectic systems may be utilized in which the semiconductor phase is the matrix phase and the conductive material is the minor phase. These systems may be, for example, of the form $Ge-MGe_2$, $Si-MSi_2$, and $GaAs-MAs$, where M is a metal. It is desirable that the semiconductor material of the system have an absorption coefficient of incident radiation between $10^6$ cm$^{-1}$ and $1$ cm$^{-1}$.

A charge containing the constituents in proper proportions to the eutectic composition of the semiconductor material and the conductive compound is melted in a suitable crucible and solidified unidirectionally employing well known Czochralski crystal pulling techniques. A boule consisting of a composite of the semiconductor material and the conductive material that forms a eutectic with the semiconductor material is produced. The semiconductor material is in the form of a single crystal matrix with rods of the conductive material embedded in the matrix. The rods extend generally parallel to the direction of pulling.

Figure 1:
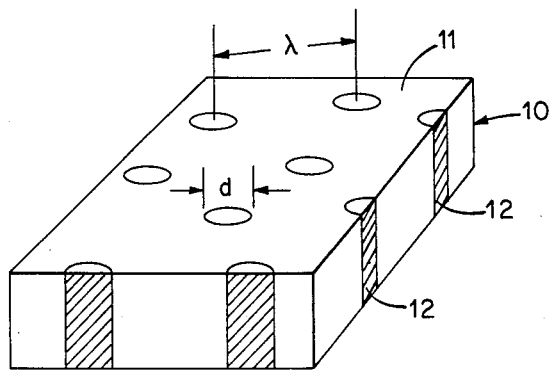
FIG. 1 is a schematic representation of a perspective view taken in cross-section of a fragment of a body which includes a matrix of semiconductor material having conductive rods disposed therein.

FIG. 1 illustrates a fragment of a section or a body 10 cut from a boule grown as above. The body consists essentially of a matrix of semiconductor material 11 and an array of rods 12 of the conductive material which forms the eutectic composition with the semiconductor material. As illustrated in FIG. 1, the upper and lower major surfaces of the body 10 are a result of cutting the boule transverse to the direction of pulling of the seed crystal. The side surfaces are formed by cuts parallel to the rods 12. Each rod 12 extends perpendicularly from the upper major surface to the lower major surface. The rods 12 are not necessarily of perfect circular cross-section nor are they necessarily perfectly parallel. The rods 12 are, however, each individual elements and do not interconnect, and the semiconductor matrix 11 is entirely interconnected and surrounds each of the individual rods.

The semiconductor material of the melt is appropriately doped with conductivity type imparting material of either N- or P-type so that Schottky barriers are formed between the conductive rods 12 and the semiconductor matrix 11. The carrier concentration in the semiconductor material is from $10^{14}$ to $10^{18}$ cm$^{-3}$. The volume fraction of the rods 12 in the body 10 should be between 0.5% and 15%. The inter-rod spacing of a composite formed by eutectic solidification is given by $\lambda^2 v = $ constant where $\lambda$ is the average inter-rod spacing, $v$ is the growth rate, and the constant is a characteristic of the particular eutectic system. The rod diameter (d) is related to the inter-rod spacing ($\lambda$) by the volume fraction of the rod material as determined by the eutectic phase diagram of the particular eutectic system. For suitable device structures the inter-rod spacing ($\lambda$) should be between 1 and 50 micrometers, and the rod diameter (d) should be between 0.1 and 15 micrometers.

Figure 2:
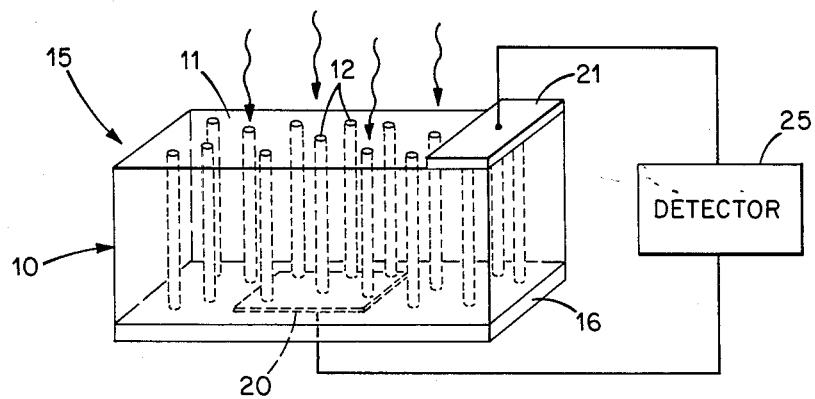
FIG. 2 is a schematic representation in perspective illustrating apparatus in accordance with the present invention.
Figure 2A:
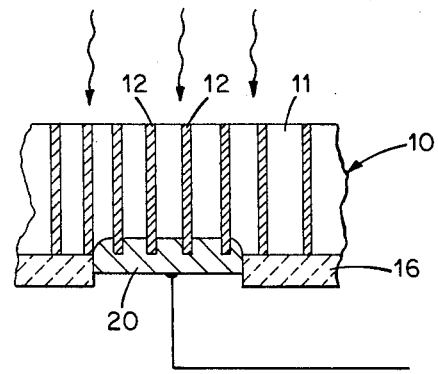
FIG. 2A is a view in cross-section illustrating a portion of the device of FIG. 2.

The apparatus illustrated in FIG. 2 includes a device 15 fabricated from a body of a eutectic composite 10 as illustrated in FIG. 1. FIG. 2A illustrates a portion of the device 15 in cross-section. For purposes of discussion the semiconductor matrix 11 is of single crystal silicon with conductive rods 12 of tantalum silicide ($TaSi_2$) grown from a Si-$TaSi_2$ eutectic composition. Examples of other suitable Si-silicide eutectic systems are Si-tungsten silicide, Si-niobium silicide, Si-molybdenum silicide, and Si-zirconium silicide.

By employing conventional techniques of forming silicon oxide layers and standard photolithographic masking and etching techniques an oxide layer 16 having an opening therein exposing several of the rods 12 at one ends thereof is formed on a surface of the body 10. A conductive contact member 20 is then formed in the opening in the silicon oxide layer 16. In forming the conductive contact member 20, a suitable metal which forms a conductive compound when reacted with silicon and forms a rectifying contact to silicon, specifically cobalt, is deposited over the layer of silicon oxide and the exposed surface of the body at the opening in the oxide layer. The body is then subjected to a rapid thermal annealing treatment by heating at a temperature of about 800° C. for about 12 seconds to cause the cobalt in contact with silicon to react and form a conductive member 20 of cobalt disilicide. The cobalt over the silicon oxide does not react and remains as cobalt. This unreacted cobalt is then readily removed by a suitable chemical etch which attacks the cobalt but does not significantly affect the cobalt disilicide or other structural elements of the device.

In the resulting structure as illustrated in FIG. 2A the cobalt disilicide contact member 20 forms an ohmic contact with the ends of several of the $TaSi_2$ rods 12. The interface of the cobalt disilicide contact member 20 with the silicon of the matrix 11 is a Schottky rectifying barrier. The rectifying barrier formed between the contact member 20 and the semiconductor matrix 11 should have a barrier potential which is equal to or higher than the barrier potential of the rectifying barrier between the conductive rods 12 and the semiconductor matrix 11. Platinum silicide has a high potential barrier with N-type silicon and yttrium silicide has a high potential barrier with P-type silicon. Other silicide-forming metals which may be used include nickel, titanium, tantalum, tungsten, and molybdenum.

As illustrated in FIG. 2 a second contact member 21 is formed on the body 10. This second contact member 21 is in ohmic contact with the silicon 11 of the matrix, and, for example, may be of gold doped with antimony for making ohmic contact to N-type silicon. The contact member 21 also makes contact to some of the rods of the array of rods 12. However, the contact member 21 is located such that these rods are not in contact with the first contact member 20. Therefore, they are not active elements of the device and there is no effect on the operation of the device.

The first contact member 20 is applied to one of the major surfaces of the body 10 at the ends of several of the rods 12. The other ends of the rods terminate at the opposite major surface of the body 10. The portion of this surface (the upper major surface of FIGS. 2 and 2A) adjacent to those rods which are in ohmic contact with the first contact member 20 is exposed so as to receive incident radiation as indicated.

Radiation detecting apparatus in accordance with the present invention also includes a detector 25 which is connected to the first contact member 20 and to the second contact member 21. The detector 25 may be any form of detection apparatus which detects the flow of current and/or utilizes the flow of current for any purpose.

The apparatus responds to electromagnetic or particle radiation which impinges on the silicon matrix at the portion of the upper major surface of the body 10 between the other ends of those rods 12 which have their one ends in contact with the first contact member 20. Radiation which strikes this area penetrates into the silicon of the matrix 11 adjacent to the rectifying barriers at the interfaces of the rods 12 and the semiconductor matrix 11. Electrical current within the device is generated in the conventional manner. Holes or electrons are produced by the absorption of light in the silicon matrix. The holes or electrons diffuse to the junctions and are collected causing current flow through the silicon structure and the external circuit including the detector 25. Since the rectifying junctions extend into the silicon matrix transverse to the surface, absorption of the radiant energy takes place near a junction regardless of the depth of penetration. Thus, the distance of diffusion required for collection of the holes or electrons generated by the absorption of the incident radiation is always very small with reduced possibility of encountering a recombination center.

Radiation detecting apparatus in accordance with the present invention employed a device 15 fabricated from a Si-$TaSi_2$ eutectic composite, which was produced in accordance with the teachings in application Ser. No. 940,371, filed Dec. 11, 1986, by Brian M. Ditchek entitled "Method of Producing a Semiconductor Device" and assigned to the assignee of the present application. The Si-$TaSi_2$ eutectic composite was grown directly from a melt in a Czochralski crystal growth furnace in accordance with Czochralski crystal pulling techniques. A charge of silicon and tantalum was placed in a quartz crucible with a graphite susceptor. The tantalum was 5.5% by weight of the charge, providing the mole ratio of silicon to tantalum in the Si-$TaSi_2$ eutectic composition. The silicon in the charge was doped with phosphorus. After rf heating the charge to above the eutectic temperature and obtaining charge homogenization, a (111) orientation silicon seed crystal was lowered onto the melt surface. Composite boules were pulled from the melt at a growth rate (v) of 20 cm/h in a flowing argon atmosphere. The resulting boule was approximately 2.5 cm in diameter and 12 cm in length. The silicon matrix phase was of single crystal (111) orientation and was free of grain boundaries. The boule was 2% by volume of conductive, metallic, $TaSi_2$ rods. At a transverse-cut major surface the composite contained $1.6 \times 10^6$ $TaSi_2$ rods/cm$^2$ with an average rod diameter (d) of 1.2 micrometers. The average inter-rod spacing ($\lambda$) was 7.9 micrometers. The carrier concentration in the silicon matrix as determined by Hall measurements varied from $1.1 \times 10^{15}$ cm$^{-3}$ at one end of the boule to $1.8 \times 10^{15}$ cm$^{-3}$ at the opposite end. The electron mobility in the matrix was approximately 925 cm$^2$/V-sec.

Devices were fabricated from 500 micrometer thick slices of the boule. A 0.2 micrometer thick silicon oxide coating was grown on one major surface of the slice. Conventional processing techniques were employed to form $1.8 \times 10^{-3}$ cm² openings in the oxide coating. Cobalt disilicide contact members 20 were formed in the openings in accordance with the teachings in U.S. Pat. No. 4,724,223 by Brian M. Ditchek entitled "Method of Making Electrical Contacts" and assigned to the assignee of the present application. The cobalt disilicide provided ohmic metallic contacts to the exposed ends of the TaSi₂ rods while forming Schottky barriers with the silicon of the matrix. The Schottky barrier between the cobalt disilicide and the silicon has a higher barrier potential than the Schottky barriers between the TaSi₂ rods and silicon. An ohmic contact 21 was formed adjacent to the edge of the body on the opposite major surface as illustrated in FIG. 2. The contact member 21 was formed by depositing and alloying a gold-antimony film.

Based on the area of the cobalt disilicide contact member 20 and the rod density, the effective region of a device contains about 3,000 rods. For a 500 micrometer thick device the total junction area is $5.6 \times 10^{-2}$ cm². This area is approximately 30 times the area of contact of the cobalt disilicide member to the silicon matrix.

Figure 3:
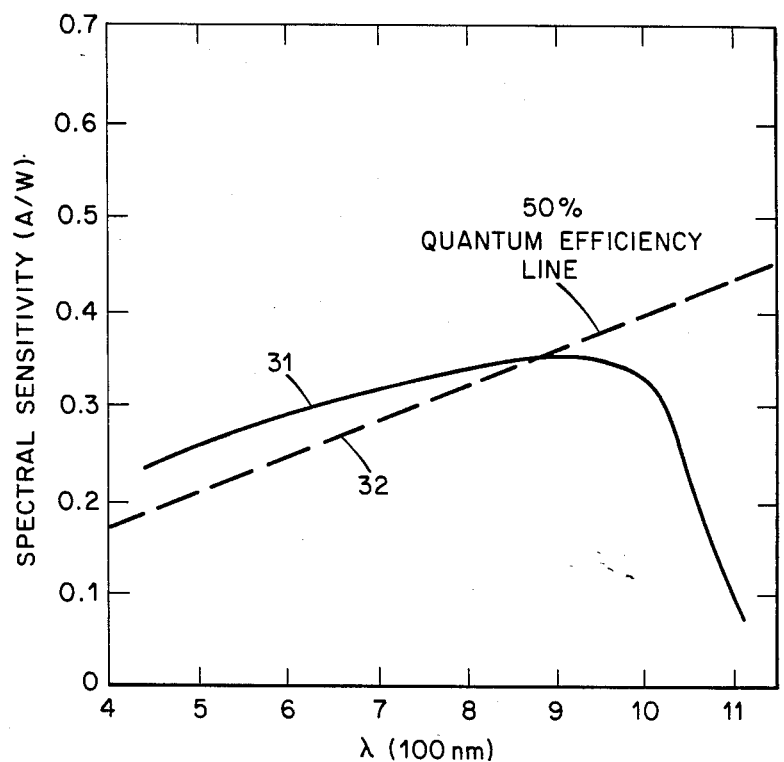
FIG. 3 is a graph illustrating the spectral sensitivity of apparatus in accordance with the present invention.

The spectral sensitivity of the device, that is, the electrical current produced per unit of incident radiation power over a range of wavelengths, is illustrated by the curve 31 in FIG. 3. The data as plotted is corrected for calculated reflection losses from the silicon surface. For incident light between 450 and 1000 nanometers the response is approximately proportional to the wavelength. This result indicates an approximately constant quantum efficiency in this range. After correction for reflection losses the quantum efficiency is approximately 50%, indicated by line 32 in FIG. 3.

Radiation detection devices in accordance with the present invention as described are efficient over a wider spectral range than conventional planar devices. The conductive rods are disposed throughout the silicon matrix so as to provide closely-spaced junctions throughout the bulk of the device. Thus, nearly the entire volume of the device is utilized to collect charge carriers produced by incident radiation. Charge carriers generated by the absorption of radiant energy are never more than a very short distance from a junction regardless of their depth of penetration into the bulk of the device. In the specific devices described, the distance is no more than 5 micrometers. Therefore, charge carriers are collected with essentially equal efficiency over a large range of depths with reduced possibilities of encountering recombination centers. The sensitivity of the apparatus is thus near a maximum for a wide range of wavelengths.

While there has been shown and described what is considered a preferred embodiment of the present invention, it will be obvious to those skilled in the art that various changes and modifications may be made therein without departing from the invention as defined by the appended claims.

What is claimed is:

1. Radiation detecting apparatus comprising
    a body including a matrix of single crystal semiconductor material having disposed therein an array of individual rods of conductive material forming rectifying barriers at the interfaces of the rods and the semiconductor material;
    said rods of said array being distributed throughout said body;
    a first conductive contact member at a first surface of said body in ohmic contact with a plurality of said rods at one end of the rods of said plurality;
    a second conductive contact member in ohmic contact with the semiconductor material of said matrix;
    said body being adapted to receive incident radiation at a portion of a second surface thereof, said portion being adjacent to some of the rods of said plurality so that charge carriers produced by the absorption of radiation in the body are collected at the rectifying barriers thereof; and
    current detecting means connected to said first and second conductive contact members for detecting the flow of electrical current generated by the collection of charge carriers at rectifying barriers.

2. Radiation detecting apparatus in a accordance with claim 1 wherein
    said rods of said array are disposed generally parallel to each other and transverse to said first surface of said body with said rods having said one ends thereof at said first surface.

3. Radiation detecting apparatus in accordance with claim 2 wherein
    the conductive material of said rods is a conductive compound of a metal and the semiconductor material of the matrix or of a metal and a constituent element of the semiconductor material.

4. Radiation detecting apparatus in accordance with claim 3 wherein
    each of said rods of said plurality has the other end thereof at said portion of said second surface.

5. Radiation detecting apparatus in accordance with claim 4 wherein
    said first conductive contact member is in ohmic contact with each of said rods of said plurality and is in rectifying contact with semiconductor material of said matrix at said first surface of the body.

6. Radiation detecting apparatus in accordance with claim 5 wherein
    the potential barrier of the rectifying barrier between said first conductive contact member and the semiconductor material of the matrix is equal to or greater than the potential barrier of the rectifying barrier between said rods and the semiconductor material of the matrix.

7. Radiation detecting apparatus in accordance with claim 6 wherein
    the mole ratio of semiconductor material to the metal in the matrix and array of rods is approximately equal to the mole ratio of the semiconductor material to the metal in the eutectic composition of the semiconductor material and the conductive compound.

8. Radiation detecting apparatus in accordance with claim 7 wherein
    semiconductor material is selected from the group consisting of silicon, germanium, III-V compound semiconductor materials, and II-VI compound semiconductor materials.

9. Radiation detecting apparatus in accordance with claim 8 wherein
    said semiconductor material is silicon; and
    said metal is selected from the group consisting of tantalum, tungsten, niobium, molybdenum, and zirconium.

10. Radiation detecting apparatus comprising a body including a matrix of single crystal semiconductor material having disposed therein an array of individual rods of conductive material forming rectifying barriers at the interfaces of the rods and the semiconductor material;

said body having opposite first and second parallel major surfaces;

said rods of said array being distributed throughout said body;

said rods of said array being disposed generally parallel to each other and transverse to said major surfaces of the body;

each of said rods having one end thereof at said first major surface and the other end thereof at said second major surface;

a first conductive contact member in ohmic contact with a plurality of said rods at said one ends thereof;

a second conductive contact member in ohmic contact with the semiconductor material of said matrix;

the portion of said second major surface adjacent to said other ends of the rods of said plurality being adapted to receive incident radiation; and current detecting means connected to said first and second conductive contact members for detecting the flow of electrical current generated in response to incident radiation impinging on said portion of said second major surface of the body.

11. Radiation detecting apparatus in accordance with claim 10 wherein the conductive material of said rods is a conductive compound of a metal and the semiconductor material of the matrix or of a metal and a constituent element of the semiconductor material.

12. Radiation detecting apparatus in accordance with claim a 11 wherein said first conductive contact member is in ohmic contact with each of said rods of said plurality and is in rectifying contact with semiconductor material of said matrix at said first surface of the body.

13. Radiation detecting apparatus in accordance with claim 12 wherein the potential barrier of the rectifying barrier between said first conductive contact member and the semiconductor material of the matrix is equal to or greater than the potential barrier of the rectifying barrier between said rods and the semiconductor material of the matrix.

14. Radiation detecting apparatus in accordance with claim 13 wherein the mole ratio of semiconductor material to the metal in the matrix and array of rods is approximately equal to the mole ratio of the semiconductor material to the metal in the eutectic composition of the semiconductor material and the conductive compound.

15. Radiation detecting apparatus in accordance with claim 14 wherein the volume fraction of the array of rods of the conductive compound in the body is from 0.5 percent to 15 percent.

16. Radiation detecting apparatus in accordance with claim 15 wherein the semiconductor material is selected from the group consisting of silicon, germanium, III-V compound semiconductor materials, and II-VI compound semiconductor materials.

17. Radiation detecting apparatus in accordance with claim 16 wherein said semiconductor material is silicon; and said metal is selected from the group consisting of tantalum, tungsten, niobium, molybdenum, and zirconium.

18. Radiation detecting apparatus in accordance with claim 17 wherein the diameter of each of said rods is from 0.1 to 15 micrometers; and the spacing between adjacent rods is from 1 to 50 micrometers.

* * * * *

UNITED STATES PATENT OFFICE
CERTIFICATE OF CORRECTION

Patent No. 4,829,173   Dated May 9, 1989

Inventor(s)   Brian M. Ditchek et al.

It is certified that error appears in the above-identified patent and that said Letters Patent is hereby corrected as shown below:

Col. 1, between lines 7 and 8, insert as a separate paragraph

--This invention was made with government support under Contract No. F49620-86-C-0034 awarded by the Department of the Air Force. The government has certain rights in this invention.--

Signed and Sealed this

Seventeenth Day of April, 1990

Attest:

HARRY F. MANBECK, JR.

Attesting Officer   Commissioner of Patents and Trademarks